United States Patent [19]
Jansen et al.

[11] Patent Number: 5,025,451
[45] Date of Patent: Jun. 18, 1991

[54] TWO-DIMENSIONAL INTEGRATED LASER ARRAY

[75] Inventors: Michael Jansen, Los Angeles; Moshe Sergant, Culver City; Szutsun S. Ou, Manhattan Beach; Jaroslava Z. Wilcox; Jane J. Yang, both of Los Angeles; Larry R. Eaton, Huntington Beach, all of Calif.

[73] Assignee: TRW Inc., Redondo Beach, Calif.

[21] Appl. No.: 424,424

[22] Filed: Oct. 20, 1989

[51] Int. Cl.[5] ................................................ H01S 3/19
[52] U.S. Cl. ....................................... 372/50; 372/23; 372/45; 372/97
[58] Field of Search ....................... 372/50, 43, 44, 45, 372/23, 97

[56] References Cited

U.S. PATENT DOCUMENTS

| | | | |
|---|---|---|---|
| Re. 31,806 | 1/1985 | Scifres et al. | 372/50 |
| 3,996,492 | 12/1976 | McGroddy | 372/50 |
| 4,047,124 | 9/1977 | Comerford et al. | 372/50 |
| 4,255,717 | 3/1981 | Scifres et al. | 372/50 |
| 4,318,058 | 3/1982 | Mito et al. | 372/50 |
| 4,578,791 | 3/1986 | Chen | 372/50 |
| 4,680,769 | 7/1987 | Miller | 372/50 |
| 4,718,070 | 1/1988 | Liau et al. | 372/50 |
| 4,719,634 | 1/1988 | Streifer et al. | 372/46 |
| 4,730,325 | 3/1988 | Chow | 372/44 |
| 4,742,526 | 5/1988 | Matsui et al. | 372/44 |
| 4,764,937 | 8/1988 | Matsumoto et al. | 372/50 |
| 4,869,780 | 9/1989 | Yang et al. | 372/50 |

Primary Examiner—Georgia Epps
Attorney, Agent, or Firm—James M. Steinberger; Sol L. Goldstein

[57] ABSTRACT

A two-dimensional integrated laser array having a plurality of surface-emitting laser arrays and a plurality of waveguides for optically coupling the individual laser arrays together. Each surface-emitting laser array includes a plurality of injection lasers which are evanescently coupled together in order to emit a single beam of light. The coupling provided by the waveguides causes the surface-emitting laser arrays to operate in phase and at the same wavelength as an external master oscillator. Therefore, the surface-emitting laser arrays generate coherent beams of light, which are combined and focused by a micro-lens. The output of the micro-lens is a single, coherent high-power optical beam which is emitted perpendicular to the two-dimensional integrated laser array.

16 Claims, 3 Drawing Sheets

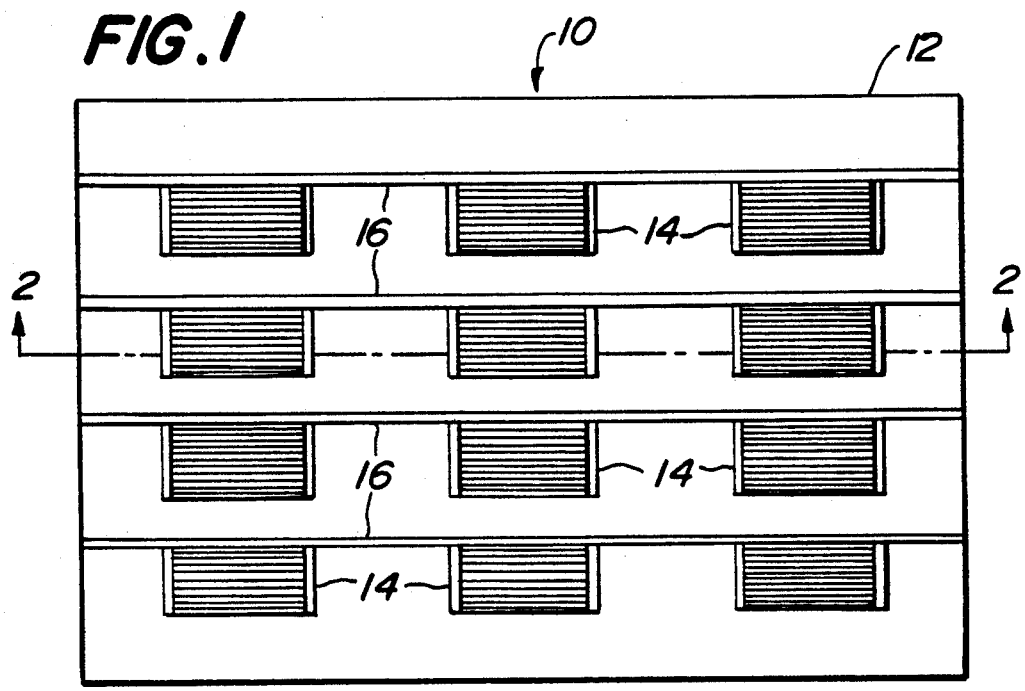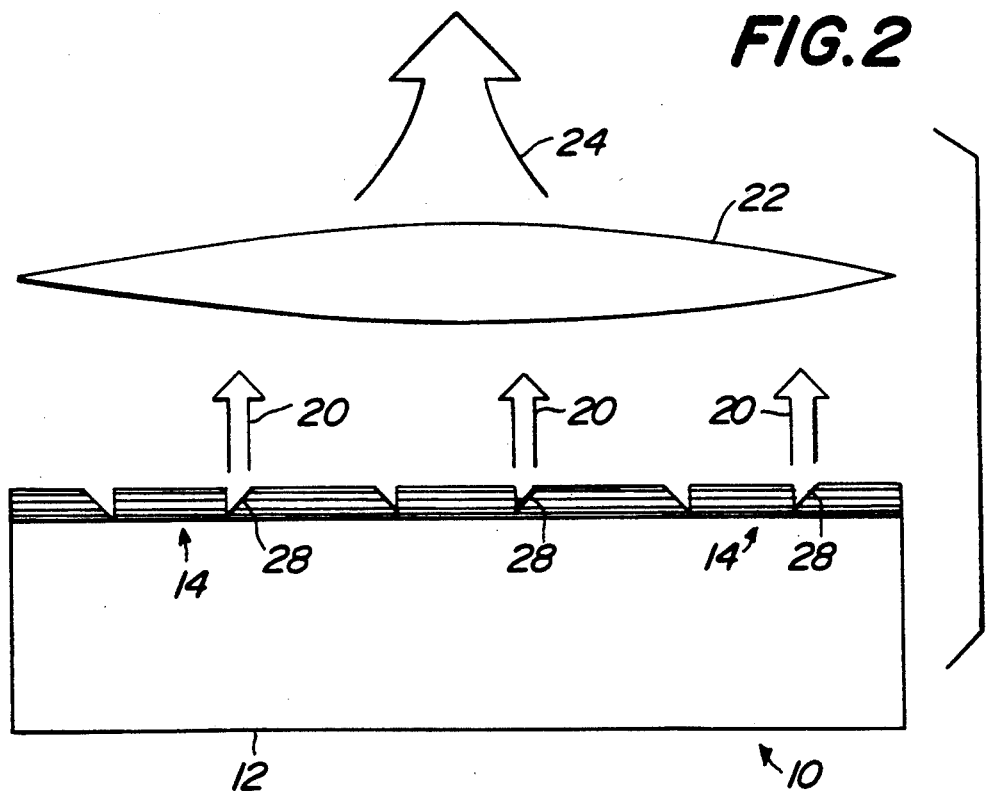

TWO-DIMENSIONAL INTEGRATED LASER ARRAY

BACKGROUND OF THE INVENTION

This invention relates generally to semiconductor lasers and, more particularly, to relatively high-power semiconductor lasers formed by coupling multiple semiconductor laser elements together.

Relatively high-power laser light sources are required in many optical communication systems for transmitting signals over long distances with high signal-to-noise ratios. Semiconductor injection lasers are particularly well suited for these types of systems because of their small size and reliability.

A semiconductor injection laser is a laser device in which a forward bias voltage is applied across a junction formed between an n-doped and a p-doped semiconductor layer. Excess electrons from the n-doped layer and excess holes from the p-doped layer are injected into an active region of the p-n junction by the bias voltage, where the excess electrons and holes recombine. At low current levels, the electrons recombine with the holes to produce spontaneous emission of photons in all directions in the active region. At higher current levels, the excess carrier density becomes high enough to produce an inverted population, yielding a positive gain. Stimulated emission occurs and a monochromatic, highly directional beam of light is emitted from the active region. The active region is bounded at opposite ends by cleaved crystal facets, one being a highly reflective surface and the other being a partially-reflecting surface through which the beam emerges. The active region is also bounded by etched side surfaces, to prevent emission in the lateral direction.

The power output of a single semiconductor injection laser is rather small and, therefore, is inadequate for most types of optical communication systems. The power output of an injection laser is limited by its power density and by the finite cross section of its active region. Operating an injection laser beyond its power density limit results in catastrophic damage or at least serious degradation in performance, principally due to pitting of the crystal facets or due to the formation of dark line defects.

Coupling multiple semiconductor injection lasers together in an array provides for greatly increased power output levels. Individual injection lasers can be optically coupled using several different techniques. One technique is to evanescently couple the injection lasers together by positioning the lasers in a parallel fashion in close proximity to each other, causing the optical waves produced by adjacent lasers to overlap. Another technique is to directly couple the injection lasers together through the use of Y-junction waveguides. Although these techniques significantly boost power output levels, only a limited number of lasers can be coupled together using these techniques because of amplified spontaneous emission, thermal effects and waveguide breakdown. Accordingly, there has been a need for a technique for integrating large numbers of semiconductor injection lasers, preferably over a full wafer, that does not suffer from these disadvantages. The present invention is directed to this end.

SUMMARY OF THE INVENTION

The present invention resides in a two-dimensional integrated laser array and a related method for coupling large numbers of semiconductor injection lasers together to produce a single, coherent high-power optical beam. The integrated laser array includes a plurality of surface-emitting laser arrays and a plurality of waveguides for optically coupling the individual laser arrays together. Each surface-emitting laser array includes a plurality of injection lasers which are evanescently coupled together in order to emit a single beam of light. The coupling provided by the waveguides causes the surface-emitting laser arrays to operate in phase and at the same wavelength as an external master oscillator. Therefore, the surface-emitting laser arrays generate coherent beams of light, which are combined and focused by a micro-lens. The output of the micro-lens is a single, coherent high-power optical beam that is emitted perpendicular to the two-dimensional integrated laser array.

It will be appreciated from the foregoing that the present invention represents a significant advance in the field of semiconductor lasers. In particular, the present invention provides for wafer-scale integration of semiconductor injection lasers, producing a single, coherent high-power optical beam from the lasers. Other features and advantages of the present invention will become apparent from the following more detailed description, taken in conjunction with the accompanying drawings, which illustrate, by way of example, the principles of the invention.

BRIEF DESCRIPTION OF THE DRAWINGS

FIG. 1 is a plan view of a two-dimensional integrated laser array in accordance with the present invention;

FIG. 2 is a cross-sectional view of the two-dimensional integrated laser array along the line 2—2 of FIG. 1;

DETAILED DESCRIPTION OF THE PREFERRED EMBODIMENTS

Figure 3:
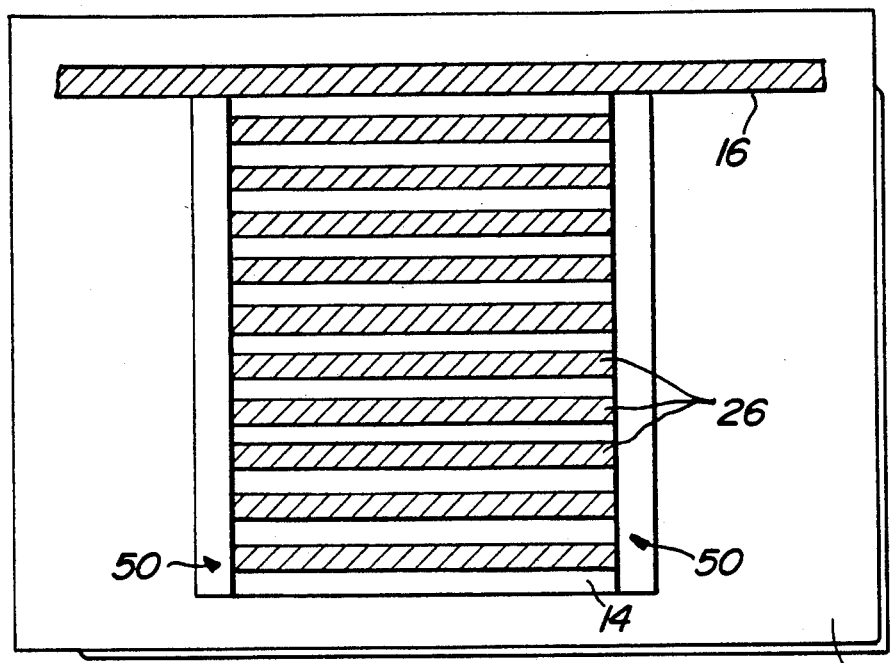
FIG. 3 is an enlarged plan view of an individual surface-emitting laser array, which is integrated with other surface-emitting laser arrays using the technique of the present invention.

As shown in the drawings for purposes of illustration, the present invention is embodied in a two-dimensional integrated laser array for coupling large numbers of semiconductor injection lasers together to produce a single, coherent high-power optical beam. Most types of optical communication systems require a relatively high-power laser light source for transmitting signals over long distances with high signal-to-noise ratios. Semiconductor injection lasers are particularly well suited for these types of systems because of their small size and reliability. Unfortunately, however, the power output of a single semiconductor injection laser is inadequate for most types of optical communication systems. Coupling multiple semiconductor injection lasers together in an array provides greatly increased power output levels. However, only a limited number of lasers can be coupled together before serious degradation in performance occurs.

In accordance with the present invention, a two-dimensional integrated laser array includes a plurality of surface-emitting laser arrays and a plurality of waveguides for optically coupling the individual laser arrays together. Each surface-emitting laser array includes a plurality of injection lasers which are evanescently coupled together in order to emit a single beam of light. The coupling provided by the waveguides causes the surface-emitting laser arrays to operate in phase and at the same wavelength as an external master oscillator. Therefore, the surface-emitting laser arrays generate coherent beams of light, which are combined and focused by a micro-lens. The output of the micro-lens is a single, coherent high-power optical beam which is emitted perpendicular to the two-dimensional integrated laser array.

FIGS. 1 and 2 illustrate a two-dimensional integrated laser array 10 in accordance with the present invention. The integrated laser array 10 includes a substrate 12, a plurality of individual surface-emitting laser arrays 14 formed on the substrate 12, and a plurality of waveguides 16 for optically coupling the laser arrays 14 together. The coupling provided by the waveguides 16 causes the surface-emitting laser arrays 14 to operate in phase and at the same wavelength as an external master oscillator (not shown). The external master oscillator, which is optically coupled to but also isolated from the laser array 12, provides wavelength tunability for the entire integrated laser array 12. The surface-emitting laser arrays 14 generate coherent beams of light 20, which are combined and focused by a micro-lens 22. The output of the micro-lens 22 is a single, coherent high-power optical beam 24 which is emitted perpendicular to the two-dimensional integrated laser array 10.

Figure 4:
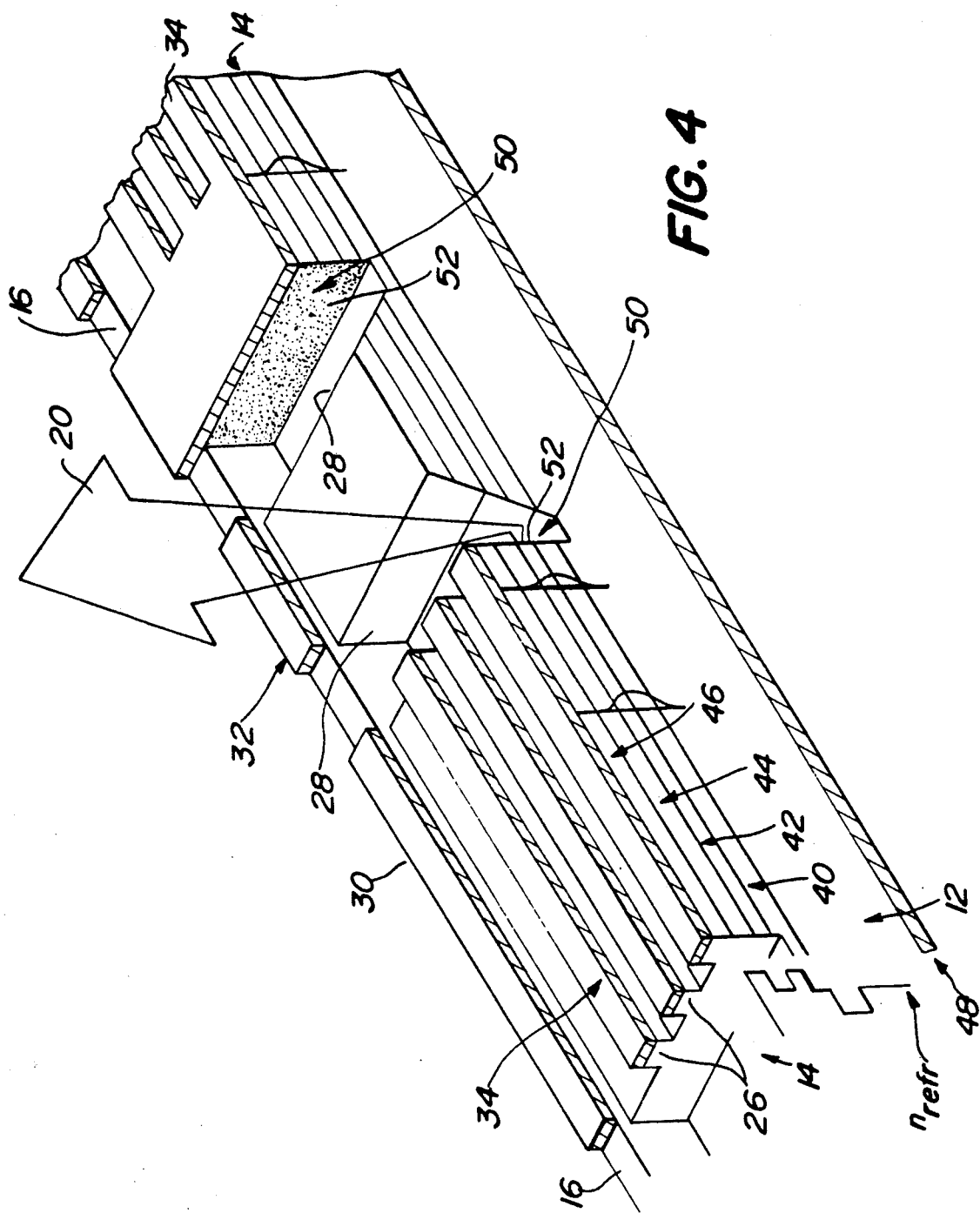
FIG. 4 is an enlarged, perspective sectional view of a surface-emitting laser array.

As shown more clearly in FIGS. 3 and 4, the individual surface-emitting laser arrays 14 each includes a plurality of heterojunction injection lasers 26 evanescently coupled together to produce the single beam of light 20. A 45 degree surface 28, which is etched into the laser array 14 at the output end of the injection lasers 26, reflects the beam of light 20, causing it to be emitted perpendicular to the surface of the laser array 14.

As shown in FIG. 4, several sets of electrodes are positioned on the top surface of the laser array 10 for controlling the surface-emitting laser arrays 14. Electrodes 30 are positioned over the waveguides 16 adjacent to the laser arrays 14, electrodes 32 are positioned over the waveguides 16 between the laser arrays 14 and electrodes 34 are positioned over the evanescently-coupled injection lasers 26. Electrodes 30 control the amount of optical energy evanescently coupled into the waveguides 16 from the laser arrays 14. Electrodes 32 control the optical beam 24 generated by the laser array 10, either by steering the optical beam or by altering its shape. The optical beam 24 can be steered by adjusting the phases between the various light beams 20 emitted by the laser arrays 14. The shape of the beam 24 can be altered, such as from a single lobe to a multiple lobe beam, by changing the supermode content of the light beams 20. Because the operating wavelength of each laser array 14 is dependent on the current drawn by that laser array and its temperature, electrodes 34 control the frequency of the light beam 20 generated by each laser array 14.

As shown in FIG. 4, each surface-emitting laser array 14 includes a plurality of heterojunction injection lasers 26 which are fabricated by growing on an n-doped GaAs substrate 12, through conventional semiconductor fabrication techniques, such as metalorganic chemical vapor deposition (MOCVD), an n-doped GaAlAs layer 40, an undoped or lightly doped (n or p) GaAs layer 42, a p-doped GaAlAs layer 44 and a p-doped GaAs layer 46. The GaAs layer 42 is the active region of the injection laser 26 and the GaAlAs layers 40, 44, which have a lower index of refraction than the GaAs layer 42, serve as the cladding layers of the laser 26. Longitudinal strips are then formed, through conventional photolithography techniques, in the top GaAs layer 46 to form the individual injection lasers 26. The waveguides guides 16 are then formed, for example, by diffusing zinc into the top surface of the laser array 10. Metal electrodes 34 are then deposited on the ohmic-contact GaAs layer 46. Metal electrodes 30, 32 are deposited over the waveguides 16 and a metal layer 48 is deposited on the bottom of the substrate 12 to form the other contact for the injection lasers 26.

Notches 50 are then formed in the top surface of the laser array 10, preferably by an ion milling method disclosed in a patent granted to some of the same inventors as the present application and assigned to the same assignee. The referenced U.S. Pat. No. 4,869,780, entitled "Ion Milling Method," is hereby incorporated by reference. The notches 50 are formed by loading the laser array 10 into an ion milling chamber and evacuating the chamber. An inert gas, such as argon, is then introduced into the chamber to maintain a predetermined vacuum pressure. An ion milling gun is aimed at the top surface of the laser array 10 at an angle of about 60 degrees from the surface. The ion milling gun is then activated, bombarding the top surface of the array 10 with a stream of atomic particles that erodes away semiconductor material that is not protected by a mask. During the milling process, the rates of removal of the semiconductor material may be controlled by adjusting the intensity of the ion gun.

The ion milling process, by virtue of the particular angle of the ion gun, produces a generally two-sided cut or notch 50 that includes a vertical surface 52 and the 45 degree surface 28. The notch 50 extends from the top surface of the laser array 10 down through the n-doped GaAlAs layer 40 to the substrate 12. The surfaces 28, 52 are finished by applying to them either a highly-reflective or anti-reflective coating. The forty-five degree surfaces 28 facing the output ends of the laser arrays 14 and the vertical surfaces 52 at the other end of the laser arrays 14 are coated with the highly-reflective coating, while the vertical surfaces 52 at the output ends of the laser arrays 14 are coated with the anti-reflective coating. These coatings allow the light produced by each laser array 14 to be emitted from the front of the array, where it is reflected by the forty-five degree surface 28 and emitted perpendicular to the surface of the laser array 10, forming the coherent beam of light 20.

Depending on the thickness of the coatings, the laser arrays 14 operate as either oscillators or amplifiers. When the laser arrays operate as oscillators, the arrays have higher efficiencies. However, when the laser arrays operate as amplifiers, the arrays can be more easily locked together and also be tuned over a wider range of frequencies by the master oscillator.

Figure 5:
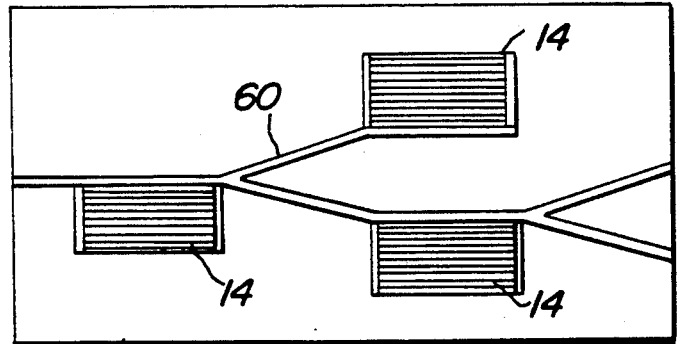
FIG. 5 is a plan view of another embodiment of the two-dimensional integrated laser array of the present invention.
Figure 6:
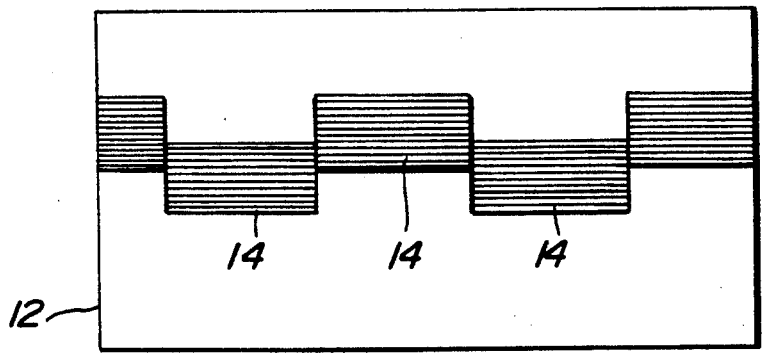
FIG. 6 is a plan view of still another embodiment of the two-dimensional integrated laser array of the present invention.

FIG. 5 and 6 illustrate other embodiments of the two-dimensional integrated laser array of the present invention. In FIG. 5, the individual surface-emitting laser arrays 14 are optically coupled together by Y- junction waveguides 60. The interference effects produced by the Y-junction waveguides 60 cause the laser arrays 14 to operate in phase and at the same wavelength as the master oscillator. In FIG. 6, the individual surface-emitting laser arrays 14 ar optically coupled by butt coupling the arrays together.

From the foregoing, it will be appreciated that the present invention represents a significant advance in the field of semiconductor laser devices. In particular, the present invention provides for wafer-scale integration of semiconductor injection lasers, producing a single, coherent high-power optical beam from the lasers. Although several preferred embodiments of the invention have been shown and described, it will be apparent that other adaptations and modifications can be made without departing from the spirit and scope of the invention. Accordingly, the invention is not to be limited, except as by the following claims.

We claim:

1. A two-dimensional integrated laser array, comprising:
    a plurality of surface-emitting laser arrays; and
    means for optically coupling the individual laser arrays together such that the laser arrays operate in phase and at the same wavelength to emit coherent beams of light.

2. The two-dimensional integrated laser array as set forth in claim 1, and further including means for combining and focusing the coherent beams of light to form a single, coherent high-power optical beam.

3. The two-dimensional integrated laser array as set forth in claim 1, wherein the means for optically coupling includes a plurality of parallel waveguides interconnected between the laser arrays.

4. The two-dimensional integrated laser array as set forth in claim 1, wherein the means for optically coupling includes a plurality of Y-junction waveguides interconnected between the laser arrays.

5. The two-dimensional integrated laser array as set forth in claim 1, wherein the means for optically coupling includes butt coupling the individual laser arrays.

6. The two-dimensional integrated laser array as set forth in claim 1, wherein each laser array includes a plurality of injection lasers evanescently coupled together to emit a single beam of light.

7. A two-dimensional integrated laser array, comprising:
    a substrate;
    a plurality of surface-emitting laser arrays formed on the substrate, each laser array including a plurality of injection lasers optically coupled together to emit a single beam of light, each injection laser having associated electrode means;
    a plurality of waveguides formed on the substrate for optically coupling the individual laser arrays together such that the laser arrays operate in phase and at the same wavelength to emit coherent beams of light; and
    means for combining and focusing the coherent beams of light to form a single, coherent high-power optical beam.

8. The two-dimensional integrated laser array as set forth in claim 7, and further including electrodes positioned over the waveguides between the surface-emitting laser arrays for controlling the optical beam generated by the integrated laser array, either by steering the beam or altering the shape of the beam.

9. The two-dimensional integrated laser array as set forth in claim 7, and further including electrodes positioned over the waveguides adjacent the surface-emitting laser arrays for controlling the amount of optical energy coupled into the waveguides from the laser arrays.

10. The two dimensional integrated laser array as set forth in claim 7, wherein each surface-emitting laser array includes an approximately 45 degree surface etched into the output end of the laser array.

11. The two-dimensional integrated laser array as set forth in claim 10, wherein the 45 degree surface is formed by ion milling a notch into the surface of the laser array.

12. A method for integrating a plurality of surface-emitting laser arrays, comprising the steps of:
    forming a plurality of surface-emitting laser arrays on a substrate; and
    optically coupling the individual laser arrays together such that the laser arrays operate in phase and at the same wavelength to emit coherent beams of light.

13. The method for integrating a plurality of surface-emitting laser arrays as set forth in claim 12, and further including the step of:
    combining and focusing the coherent beams of light to form a single, coherent high-power optical beam.

14. The method for integrating a plurality of surface-emitting laser arrays as set forth in claim 12, and further including the step of:
    forming waveguides on the substrate for optically coupling the surface-emitting laser arrays together.

15. The method for integrating a plurality of surface-emitting laser arrays as set forth in claim 12, and further including the step of:
    butt coupling the surface-emitting laser arrays on the substrate.

16. In a two-dimensional integrated laser array, a device comprising:
    a substrate;
    a plurality of surface-emitting laser arrays formed on the substrate, each laser array including a plurality of injection lasers optically coupled together to emit a single beam of light;
    a plurality of waveguides formed on the substrate for optically coupling the individual laser arrays together such that the laser arrays operate in phase and at the same wavelength to emit coherent beams of light; and
    means for combining and focusing the coherent beams of light to form a single, coherent high-power optical beam.

* * * * *